United States Patent
Lane et al.

(10) Patent No.: US 12,397,677 B2
(45) Date of Patent: Aug. 26, 2025

(54) POWER SYSTEMS AND CONTROLS FOR ELECTRIC MACHINES

(71) Applicant: Caterpillar Inc., Peoria, IL (US)

(72) Inventors: Cameron Thomas Lane, Oro Valley, AZ (US); Igor Strashny, Tucson, AZ (US)

(73) Assignee: Caterpillar Inc., Peoria, IL (US)

( * ) Notice: Subject to any disclaimer, the term of this patent is extended or adjusted under 35 U.S.C. 154(b) by 681 days.

(21) Appl. No.: 17/804,959

(22) Filed: Jun. 1, 2022

(65) Prior Publication Data

US 2023/0391225 A1  Dec. 7, 2023

(51) Int. Cl.
*B60L 58/13* (2019.01)
*G01R 31/382* (2019.01)

(52) U.S. Cl.
CPC ............ *B60L 58/13* (2019.02); *G01R 31/382* (2019.01); *H01M 2220/20* (2013.01)

(58) Field of Classification Search
CPC .... B60L 58/13; B60L 2200/36; B60L 3/0023; B60L 50/53; G01R 31/382; G01R 19/2513; H01M 2220/20
USPC .......................................................... 320/132
See application file for complete search history.

(56) References Cited

U.S. PATENT DOCUMENTS

| | | | |
|---|---|---|---|
| 4,707,761 A * | 11/1987 | Podobinski | H02H 3/087 327/91 |
| 8,798,803 B2 * | 8/2014 | Bush | B60L 50/61 701/429 |
| 9,811,086 B1 * | 11/2017 | Poeppel | G07C 5/0808 |
| 11,161,429 B2 | 11/2021 | Moriya et al. | |

(Continued)

FOREIGN PATENT DOCUMENTS

| AU | 2013200541 B2 * | 9/2014 | ............... B60L 5/04 |
|---|---|---|---|
| CN | 103072496 A | 5/2013 | |

(Continued)

OTHER PUBLICATIONS

G. M. Brown, B. J. Elbacher and W. G. Koellner, "Increased productivity with AC drives for mining excavators and haul trucks," Conference Record of the 2000 IEEE Industry Applications Conference. Thirty-Fifth IAS Annual Meeting and World Conference on Industrial Applications of Electrical Energy (Year: 2000).*

(Continued)

*Primary Examiner* — M Baye Diao
(74) *Attorney, Agent, or Firm* — Lee & Hayes

(57) ABSTRACT

An electric machine and sitewide control system and method that use a trolley power system at a worksite is disclosed. The trolley power system allows electric machines at the worksite to draw power from the trolley power system to concurrently operate to perform tasks and recharge their batteries. This allows the batteries on electric machines to be smaller than they would otherwise be, since a fully charged battery is not needed when operational power can be drawn from the trolley power system. The trolley power system is segmented, such that if one segment is faulted, the other segments can operate to provide power to electric machines at the worksite. Additionally, a sitewide controller initiates operational changes, such as a change in speed, for the electric machines at the worksite to compensate for one or more faulted segments.

17 Claims, 8 Drawing Sheets

(56) References Cited

U.S. PATENT DOCUMENTS

| | | | | |
|---|---|---|---|---|
| 2012/0136509 A1* | 5/2012 | Everett | ................ | G05D 1/0291 |
| | | | | 701/2 |
| 2013/0079959 A1* | 3/2013 | Swanson | ................ | B61C 17/12 |
| | | | | 701/19 |
| 2013/0144472 A1* | 6/2013 | Ruth | ................ | G05D 1/0278 |
| | | | | 903/902 |
| 2018/0118039 A1* | 5/2018 | Stockner | ................ | B60L 9/00 |
| 2018/0164814 A1 | 6/2018 | Poeppel | | |
| 2018/0196106 A1 | 7/2018 | Sankavaram | | |
| 2018/0287545 A1* | 10/2018 | Sieman | ................ | H02P 5/00 |
| 2020/0171966 A1* | 6/2020 | Steele | ................ | B60L 53/12 |

FOREIGN PATENT DOCUMENTS

| | | |
|---|---|---|
| CN | 203032415 U | 7/2013 |
| CN | 110208653 A | 9/2019 |
| JP | 2004098822 A | 4/2004 |
| JP | 2004359169 A | 12/2004 |
| KR | 20210048619 A | 5/2021 |

OTHER PUBLICATIONS

Written Opinion and International Search Report for Int'l. Patent Appln. No.PCT/US2023/021804, mailed Aug. 23, 2023 (10 pgs).

* cited by examiner

400 ─▶

```
┌─────────────────────────────────────────────┐
│ DETERMINE THAT A SEGMENT OF THE TROLLY POWER │
│           SYSTEM IS INOPERABLE              │
│                    402                      │
└─────────────────────────────────────────────┘
                      │
                      ▼
┌─────────────────────────────────────────────┐
│ IDENTIFY AN ELECTRIC MACHINE THAT IS TO APPROACH │
│  THE INOPERABLE SEGMENT OF THE TROLLEY POWER │
│                   SYSTEM                     │
│                    404                       │
└─────────────────────────────────────────────┘
                      │
                      ▼
┌─────────────────────────────────────────────┐
│  DETERMINE STATE OF CHARGE OF THE BATTERY OF │
│             THE ELECTRIC MACHINE             │
│                    406                       │
└─────────────────────────────────────────────┘
                      │
                      ▼
┌─────────────────────────────────────────────┐
│ DETERMINE, BASED AT LEAST IN PART ON THE STATE │
│  OF CHARGE AND THE INOPERABLE SEGMENT OF THE │
│ TROLLEY POWER SYSTEM, A CHANGE IN SPEED TO BE │
│    IMPLEMENTED FOR THE ELECTRIC MACHINE      │
│                    408                       │
└─────────────────────────────────────────────┘
                      │
                      ▼
┌─────────────────────────────────────────────┐
│  COMMUNICATE THE REQUEST FOR THE CHANGE IN   │
│     SPEED TO THE ELECTRIC MACHINE            │
│                    410                       │
└─────────────────────────────────────────────┘
```

DETERMINE THAT A SEGMENT OF THE TROLLY POWER SYSTEM IS INOPERABLE
502

↓

IDENTIFY AN ELECTRIC MACHINE THAT IS TO APPROACH THE INOPERABLE SEGMENT OF THE TROLLEY POWER SYSTEM
504

↓

DETERMINE STATE OF CHARGE OF THE BATTERY OF THE ELECTRIC MACHINE
506

↓

DETERMINE, BASED AT LEAST IN PART ON THE STATE OF CHARGE AND THE INOPERABLE SEGMENT OF THE TROLLEY LINE, A NEW ROUTE FOR THE ELECTRIC MACHINE
508

↓

COMMUNICATE THE CHANGE OF ROUTE TO THE ELECTRIC MACHINE
510

FIG. 5

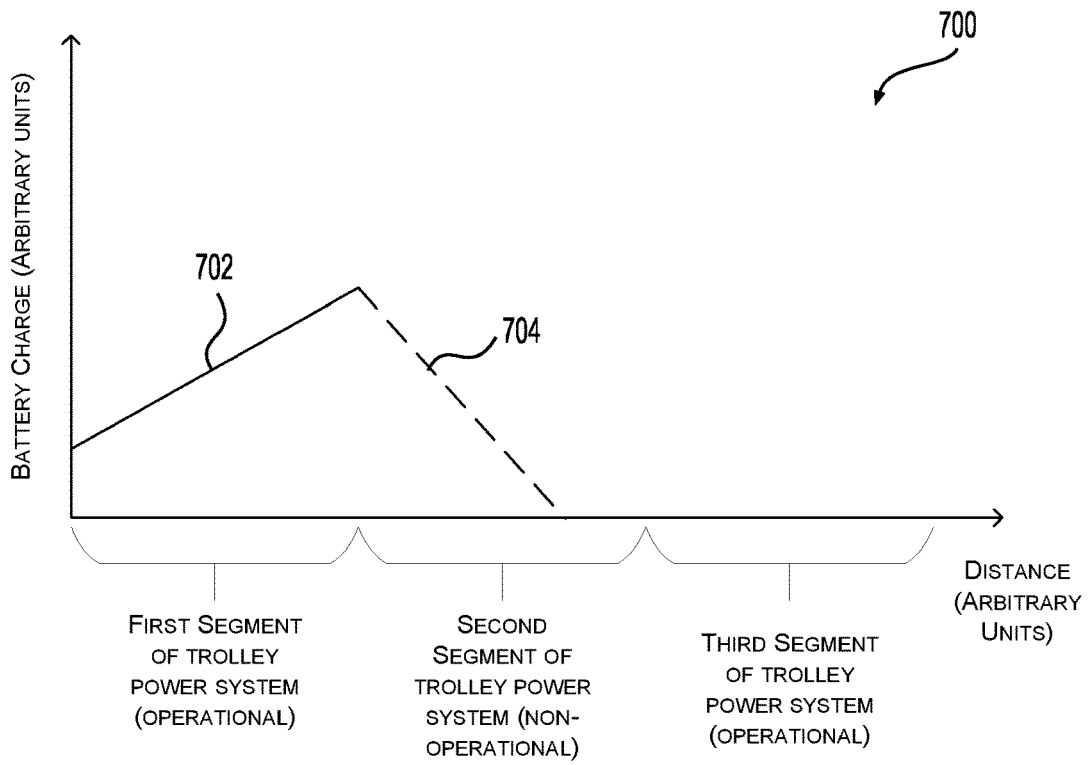
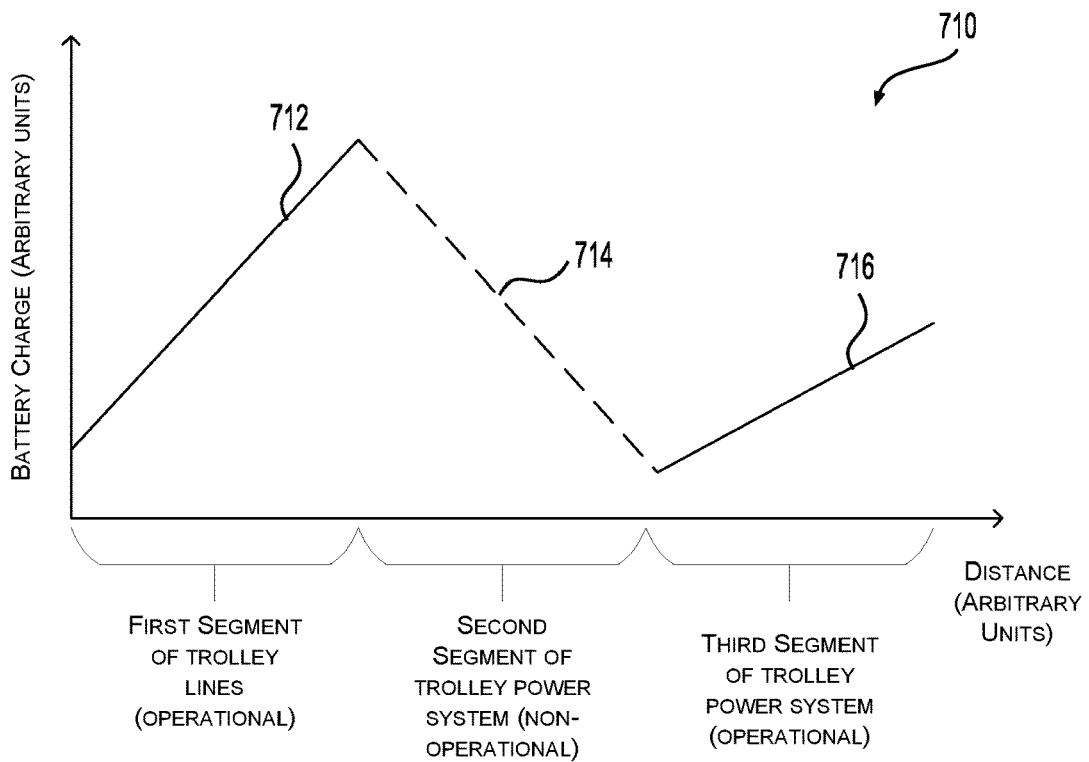
FIG. 7

POWER SYSTEMS AND CONTROLS FOR ELECTRIC MACHINES

TECHNICAL FIELD

The present disclosure relates to providing power to a machine powered by electricity. More specifically, the present disclosure relates to fault-tolerant power systems to provide improved site-level uptime of electric machines.

BACKGROUND

Machines, such as mining trucks, loaders, dozers, or other construction or mining equipment, are often powered by any variety of fuel (e.g., diesel, gasoline, etc.). Recently, there is interest in powering machines using electricity. These electric machines are used for building, construction, mining and other activities, such as at a worksite. For example, mining trucks are often used for hauling mined materials within mining sites. It is desirable to have a high uptime for these machines. As a result, a worksite, such as a mining site, may have a trolley power system to which electric machines may connect to power themselves and/or to charge their batteries. Such an arrangement has several advantages, including relatively high uptime of electric machines due to the electric machines not having to charge for long times at static charging stations. Additionally, such site arrangements may enable each of the electric machines to have smaller on-board batteries, since the electric machine is able to operate and charge itself while carrying out worksite tasks. This results in reduced weight of the electric machines, reduced cost of the electric machines, and/or improved reliability of the electric machines.

While sitewide trolley power systems with electric machines that can be powered by such power systems present various advantages, such as environmental advantages, cost advantages, and productivity advantages, such a system may be particularly vulnerable to a single point failure of the trolley power distribution systems. In other words, a failure of the trolley power systems may result in sitewide failure in powering electric machines, which can cause considerable downtime and loss of revenue. It is, therefore, desirable to increase the reliability of trolley power distribution systems at a worksite.

One mechanism for operating a single-track railway contact network is described in Chinese Patent No. 10,307,249 (hereinafter referred to as "the '249 reference"). The '249 reference describes a mechanism by which a faulted section of the contact network can be isolated. The '249 reference describes procedures to recover the faulted section of the contact network. However, the systems and methods described in the '249 reference does not pertain to the operation or control of an electric machine to enable continuous operation of the electric machine despite a fault in power delivery. Thus, the disclosure of the '249 reference does not describe how to operate electric machines at a worksite when there is a fault in power delivery via trolley power systems and how to size on-board batteries of electric machines.

Examples of the present disclosure are directed toward overcoming one or more of the deficiencies noted above.

SUMMARY

In an aspect of the present disclosure, a site controller includes one or more processors and one or more computer-readable media storing computer-executable instructions that, when executed by the one or more processors, cause the one or more processors to determine that a first segment of a plurality of segments of a trolley power system is faulted, determine that a first electric machine will approach the first segment, and determine, based at least in part on the first segment being faulted and the first electric machine approaching the first segment, that an operation of the first electric machine is to be changed. The instructions further cause the one or more processors to determine a value of a parameter associated with the operation that is to be changed; and send, to the first electric machine, the value of the parameter.

In another aspect of the present disclosure, a method includes determining, by a site controller, that a first segment of a plurality of segments of a trolley power system is faulted and determining, by the site controller, that a first electric machine will approach the first segment. The method further includes determining, by the site controller and based at least in part on the first segment being faulted and the first electric machine approaching the first segment, that an operating speed of the first electric machine is to be reduced from an original speed to a new speed while the first electric machine is drawing power from a second segment and sending, by the site controller and to the first electric machine, a message indicating the new speed.

In yet another aspect of the present disclosure, an electric machine, includes an antenna, a battery, and a controller configured to receive, from a site controller and via the antenna, a request for a state-of-charge (SOC) associated with the battery and determine the SOC. The controller is further configured to send, to the site controller and via the antenna, a message indicating the SOC, receive, from the site controller and via the antenna, a command to change speed of the electric machine from an original speed to a new speed, wherein the command is based at least in part on a segment of a trolley power system being rendered inoperable, and change, responsive to the command, the speed to the new speed.

BRIEF DESCRIPTION OF DRAWINGS

FIG. 4 is a flow diagram depicting an example method for communicating a change in speed, responsive to a fault in the trolley power system, to the electric machine of FIG. 1, according to examples of the disclosure.

FIG. 5 is a flow diagram depicting an example method for communicating a change in route, responsive to a fault in the trolley power system, to the electric machine of FIG. 1, according to examples of the disclosure.

FIG. 7 are charts illustrating the control of the electric machine of FIG. 1 when a fault in a segment of a trolley power system is encountered, according to examples of the disclosure.

DETAILED DESCRIPTION

Wherever possible, the same reference numbers will be used throughout the drawings to refer to the same or like parts.

Figure 1:
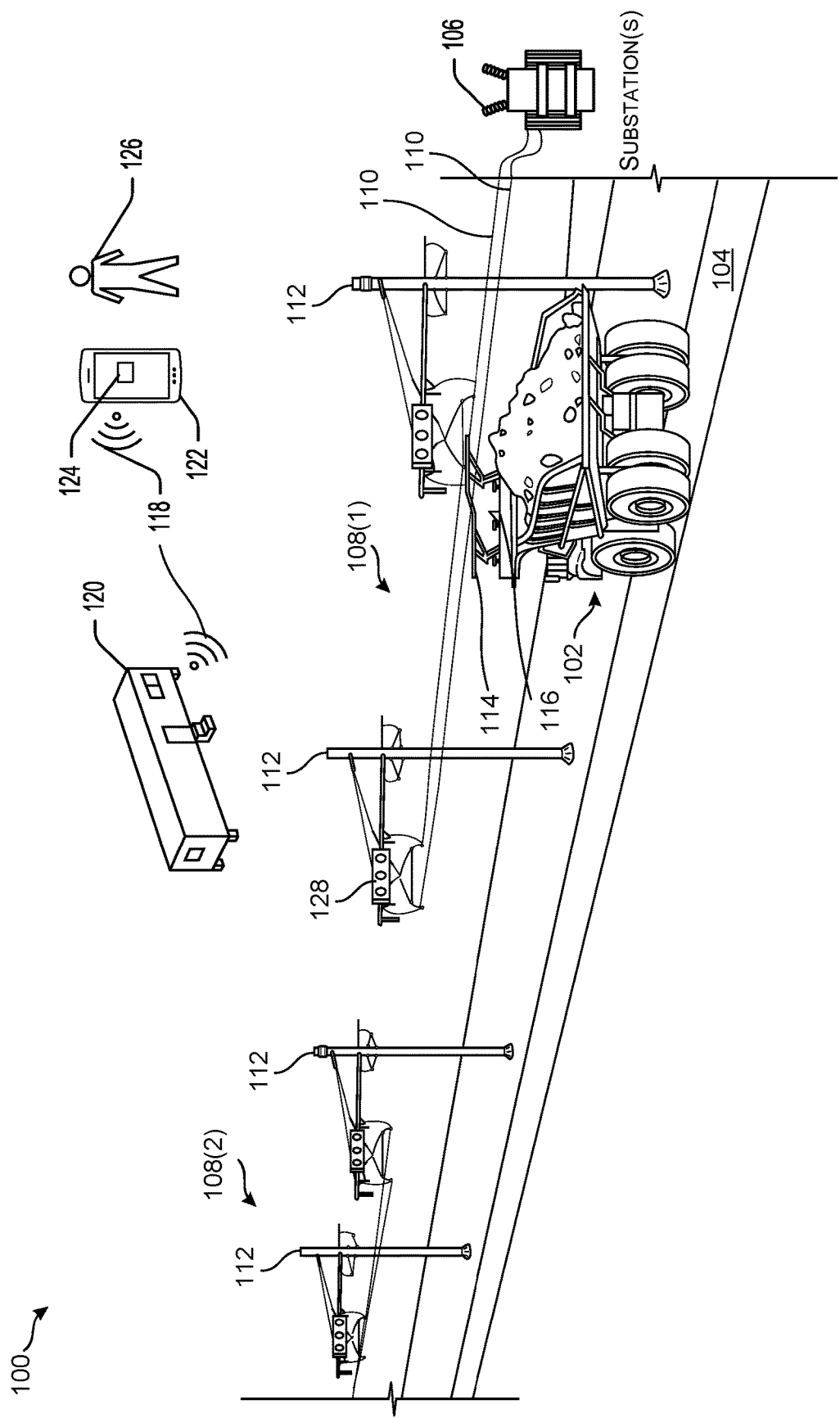
FIG. 1 is a schematic illustration of an example worksite with an electric machine, in accordance with examples of the disclosure.

FIG. 1 is a schematic illustration of an example worksite 100 with an electric machine 102, in accordance with examples of the disclosure. The electric machine 102, as depicted may travel on ground 104, such as along paths on the worksite 100. While the electric machine 102 may have a battery, as will be discussed in conjunction with FIG. 2 below, the electric machine 102 receives power from power facilities at the worksite 100, such as a substation 106 or a plurality of substations 106. The substations 106 may provide power from any suitable source, such as a commercial electric grid or from generation facilities (not shown) at the worksite 100. It should be understood that in some cases, the worksite 100 may include both electric machines 102, as well as conventional machines (e.g., internal combustion engine machines) or any other type of machine (e.g., battery-only electric machines, hybrid machines, etc.).

According to the disclosure herein, the electrical power from the substations 106 are provided to the electric machine 102 via one or more segments of a trolley power system 108(1), 108(2) (hereinafter referred to in the singular as segment of the trolley power system 108 or segment 108 and in the plural as segments of the trolley power system 108 or segments 108). Although two segments of the trolley power system 108 are shown here, it should be understood that there may be any number of segments of the trolley power system 108 at a worksite 100. Each of the segments of the trolley power system 108 are electrically separate from each other, such that if one segment 108 is rendered inoperable, other segments 108 can still provide power to the electric machine 102. Each of the segments 108 may be electrically connected to the same substation 106 or to separate substations 106. Further still, some segments 108 may be electrically connected one substation 106, while other segments 108 may be electrically connected to other substations 106.

The segments 108 may be configured to provide to the electric machine 102 any suitable type and/or magnitude of electrical power. In some cases, the segments 108 may provide alternating current (AC) power at any suitable frequency, voltage and current. In other cases, the segments 108 may provide direct current (DC) power at any suitable voltage and current. In one non-limiting example, the segments 108 may provide +1500 VDC and −1500 VDC to the electric machine 102. These values are merely examples, and other electrical configurations for the segments 108 are available within the knowledge of those of ordinary skill in the art.

Each of the segments of the trolley power system 108 may carry one or more power lines 110, as held by one or more poles 112. The power lines 110 may be constructed of any suitable conductor, such as cables of any suitable gauge, conductance, etc. Although the power lines 110 are depicted as not connected between the first segment 108(1) and second segment 108(2), it should be understood that the power lines 110 may be physically connected between segments 108, but electrically isolated between segments 108. Such a configuration may entail having "dummy connectors" (not shown) between segments 108, which are electrically isolated from one or both segments 108 between which they are disposed.

The electric machine 102 includes a connector 114 that allows the electric machine 102 to be electrically and/or physically connected to a segment 108 and derive electrical power therefrom. As the electric machine 102 moves along the ground 104, the connector 114 may receive power from a sequence of segments 108. The connector 114 may be configured to capture and/or release the power lines 110 and receive power from those power lines 110. In the case where the power lines 110 are discontinuous between segments, the connector 114 may be configured to release the power lines 110 of one segment 108 and capture the power lines 110 of the next segment 108. Alternatively, in the case of when the power lines 110 are continuous between segments 108, such as via dummy connectors between segments 108, the connector 114 may remain coupled to the power lines 110 between segments 108, even if not drawing power while traversing portions of the dummy connectors.

As depicted here, the power lines 110 of the segments of the trolley power system 108 are overhead. However, it should be understood that the power lines 110 may be provided in any suitable configuration, in accordance with the disclosure herein. For example, the power lines 110 may be provided as rigid rails that run along the side of paths on the worksite 100 or as cables that are on the ground 104. Indeed, the power lines 110 may be in any suitable location relative to the electric machine 102 on the worksite 100. Additionally, the connector 114 may be of any suitable configuration to accommodate any suitable configuration of the power lines 110. For example, telescopic rods, spring-biased contactors, slot connectors, or the like may be used to make contact to any suitable configuration of power line 110 and conduct electrical power to the electric machine 102. In some cases, where AC power is provided through the power lines 110, the connectors may even be inductively and/or capacitively coupled to the power lines 110. Regardless of the exact type of power line 110 and/or connector 114, the power delivery is partitioned into independent segments 108, such that a fault in one segment 108 does not affect other segments 108.

The electric machine 102 may further be configured to communicate wirelessly, such as via antenna 116. The antenna 116 allows the electric machine 102 to receive and/or send wireless signals 118 from/to a site control center 120 and/or a electronic device 122 having controller 124. The controller 124, or site controller 124, may be configured to interact with one or more human operators 126, such as via the electronic device 122 and/or the site control center 120. The controller 124 may include any suitable combination of hardware, software, and/or firmware to provide the functionality discussed herein for managing the operations of electric machines 102.

The controller 124 is configured to receive information from one or more electric machines 102, such as state-of-charge (SOC) values associated with the electric machines 102. The controller 124 is further configured to generate task commands to send via the wireless signals 118 to one or more electric machines 102 at the worksite 100. The controller 124 is further configured to send change in operation requests/commands to the electric machines 102 to effect a change in any variety of tasks being performed by the electric machines 102. For example, the controller 124 is configured to request an electric machine 102 to change its speed or change its route within the worksite 100. In some cases, the request to change operations of the electric machine 102 may automatically control the electric machine 102, such as when the electric machine 102 is autonomously controlled. In other cases, the request to change operations of the electric machine 102 may be presented to a human operator of the electric machine 102.

The controller 124 may be controlled by the operator 126 (e.g., worksite manager, construction worker, miner, farmer, paver, etc.) via one or more human machine interface(s) (HMIs) of the electronic device 122, in some cases. In other cases, the controller 124 may operate autonomously or semi-autonomously. The controller 124 may also be configured to provide worksite 100 level updates to the operator 126, such as via the HMIs of the electronic device 122. The human operator 126 may provide any variety of parameters, corresponding to desired operating characteristics of the electric machine 102, such as current task, SOC, destination location, speed, etc. These parameters may be encoded by the controller 124 into a task request or command that is transmitted to the electric machines 102 via the wireless signal 118.

In some instances, the communications between the electronic device 122 having the controller 124 and the electric machines 102 may be via protocol based communications (e.g., direct Wi-Fi, Wi-Fi, the Internet, Bluetooth, etc.), and in other instances, the communications may be non-protocol-based communications (e.g., remote control). In examples of the disclosure, the worksite 100 with communications between one or more electronic devices 122 and one or more electric machines 102 may result in a worksite level network, such as a local area network (LAN) or a wide-area network (WAN). Although the electronic device 122 is depicted herein as a smartphone, it should be understood that the electronic device 122 may be any suitable type of electronic device. For example, the electronic device 122 may be a computer, a mobile device, a server, a tablet computer, a notebook computer, a handheld computer, a workstation, a desktop computer, a laptop, any variety of user equipment (UE), a network appliance, an e-reader, a wearable computer, a network node, a microcontroller, a smartphone, or another computing device. The controller 124 that operates on the electronic device 122 to enable it to control the operations of the electric machines 102, such as with task and/or operation change requests or commands, may be pre-loaded on the electronic device 122 and/or downloaded to the electronic device 122 from any suitable location, such as a commercial application downloading website, a private corporate website, or the like.

The controller 124 is further configured to identify when a segment of the trolley power system 108 is faulted or otherwise non-operational. In some cases, the controller 124 may receive a signal from any variety of sources to indicate that a particular segment 108 is not currently supplying electrical power. For example, the segments of the trolley power system 108 themselves may include sensors 128 that can determine that the corresponding segment is not operational and wirelessly send a signal to the controller 124 indicating the same. In other cases, the substations 106 may indicate to the controller 124 particular segments 108 that may be not be operational. In yet other cases, the operator 126, an operator of the electric machine 102, and/or other site-level personnel may observe physical damage to one or more segments 108 and report the same to the controller 124.

According to examples of the disclosure, when the controller 124 identifies one or more segments 108 that are faulted, non-operational, or otherwise unable to deliver power to electric machines 102 at the worksite 100, the controller 124 may determine changes to the operations of one or more electric machines 102 to minimize the impact of the non-operational segments 108. The controller 124 further communicates these changes to the operation of the electric machines 102 to the respective electric machines 102, such as via wireless signals 118. The changes in the operations of each of the electric machines 102 may be to mitigate any disruption of the overall work being performed at the worksite 100, such as by minimizing the downtime of each of the electric machines 102. In some cases, the change in operations of an electric machine 102 may entail a change in speed, a change in route, a delay in performing a task, a change in the number of electric machines 102 deployed concurrently, or the like.

It should be appreciated that electric machines 102 described herein may be large, heavy-duty machines that have limited range due to high amounts of energy required to power them, versus the limited space and weight available to store on-board batteries. As a result, a trolley line power system to transfer energy to the electric machines 102 while the electric machines 102 perform their allocated tasks provides power to both run the machine and charge the batteries, as disclosed herein. This results in several advantages, such as limiting the downtime of electric machines 102 at stationary charging stations and enabling electric machines 102 to have smaller and lighter on-board batteries. However, a dependence on trolley system-based charging at a sitewide level also presents potential risks, such as if the trolley charging system has a single point failure, then the whole sitewide operation is hampered or stopped until electric power is restored. Additionally, if there is a sitewide fault in the trolley power system, individual electric machines 102 must have sufficient on-board battery storage capacity to complete the rest of the task cycle or to travel it to a stationary charging station while not connected to the dynamic charging system, thereby obviating some of the advantages of having the sitewide trolley power systems. It should be understood that the disclosure herein, address and mitigate the risks associated with point failures in the dynamic trolley power systems. By segmenting the trolley power system into segments 108, the overall risk of a single point failure is minimized. While one or some segments 108 are rendered inoperable, other segments 108 are still configured to provide power to electric machines 102 at the worksite 100 for work to continue. Through a chosen combination of variable electric machine speed capability, appropriate battery sizing, length of each segment 108, and power capability of each segment 108 the worksite 100 can continue operation either at full or potentially reduced performance with one or more segments 108 unavailable, or otherwise non-operational.

As disclosed herein, a single trolley power system can be electrically segmented such that if there is a failure in a single segment, that segment 108 is isolated. At that point, the electric machines 102 can still operate on the remaining operational segments of the trolley power system 108 to carry on sitewide work objectives. However, to compensate for one or more inoperable segments 108, according to examples of the disclosure, electric machine 102 operations may be modified. For example, the controller 124 may modify electric machine 102 speeds and/or routes to compensate for any faulted segments 108. The advantages of the systems and methods disclosed herein will be appreciated by those having ordinary skill in the art. In particular, the mechanisms disclosed herein allow for reduced battery sizing of on-board batteries of the electric machines 102, resulting in reduced cost, reduced weight, greater reliability, better performance (e.g., greater power dedicated to tasks relative to weight), etc. For example, on-board batteries of the electric machines 102 may be "right-sized" to allow the electric machines 102 to be able to traverse a single faulted segment of the trolley system 108, with perhaps some additional safety margin. Additionally, risks are mitigated with a fault-tolerant and self-healing overall control mechanism, where tasks and operations are dynamically and/or automatically modified to compensate for any faulted segments 108. This results in greater sitewide uptime and efficiency, greater deployment of capital resources, and greater return-on-capital (ROC) and return-on-investment (ROI) of worksite 100 machinery.

Figure 2:
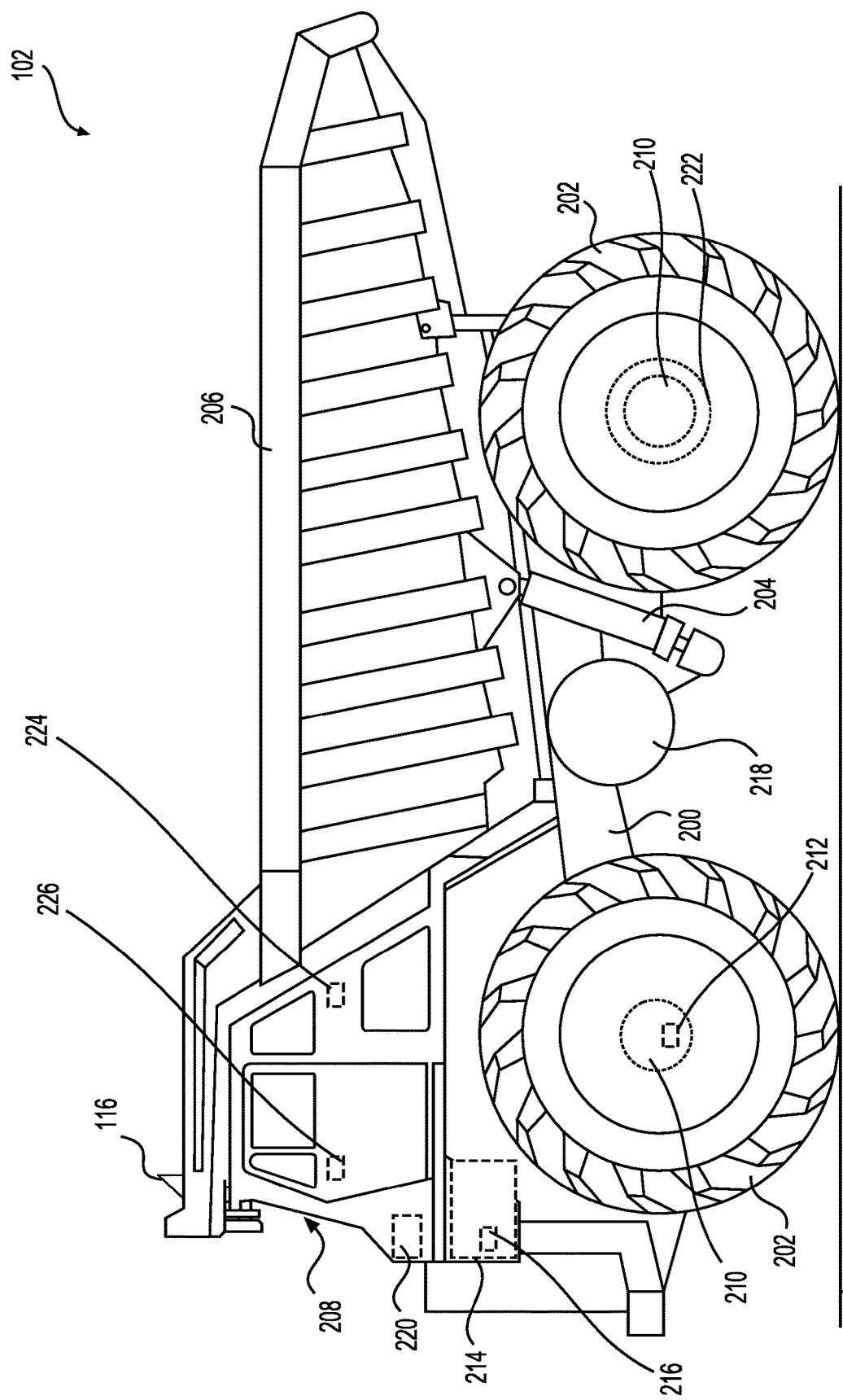
FIG. 2 is a schematic illustration of the electric machine depicted in FIG. 1, according to examples of the disclosure.

FIG. 2 is a schematic illustration of the electric machine 102 depicted in FIG. 1, according to examples of the disclosure. The electric machine 102, although depicted as a mining truck type of machine, may be any suitable machine, such as any type of loader, dozer, dump truck, skid loader, excavator, backhoe, combine, crane, drilling equipment, trencher, tractor, any suitable stationary machine, any variety of generator, locomotive, marine engines, combinations thereof, or the like. The electric machine 102 is configured for propulsion using electricity, as received via the connector 114.

The electric machine 102 is illustrated as a mining truck, which is used, for example, for moving mined materials, heavy construction materials, and/or equipment, and/or for road construction, building construction, other mining, paving and/or construction applications. For example, the electric machine 102 is used in situations where materials, such as mineral ores, loose stone, gravel, soil, sand, concrete, and/or other materials of a worksite need to be transported over the ground 104 at the worksite 100. As discussed herein, the electric machine 102 may also be in the form of a dozer, where the electric machine 102 is used to redistribute and/or move material on the ground 104. Further still, the electric machine 102 may be in the form of a compaction machine that can traverse the ground 104 and impart vibrational forces to compact the ground 104. Such a compaction machine includes drums, which may vibrate to impart energy to the ground 104 for compaction. For example, an electric machine is configured to compact freshly deposited asphalt and/or other materials disposed on and/or associated with the ground 104, such as to build a road or parking lot. It should be understood that the electric machine 102 can be in the form of any other type of suitable construction, mining, farming, military, and/or transportation machine. In the interest of brevity, without individually discussing every type of construction and/or mining machine, it should be understood that the electric drive mechanisms, as described herein, are configured for use in a wide variety of electric machines 102.

As shown in FIG. 2, the electric machine 102 includes a frame 200 and wheels 202. The wheels 202 are mechanically coupled to a drive train (not shown) to propel the electric machine 102. When the wheels 202 of the electric machine 102 are caused to rotate, the electric machine 102 traverses the ground 104. Although illustrated in FIG. 2 as having a hub with a rubber tire, in other examples, the wheels 202 may instead be in the form of drums, chain drives, combinations thereof, or the like.

The frame 200 of the electric machine 102 is constructed from any suitable materials, such as iron, steel, aluminum, other metals, ceramics, plastics, the combination thereof, or the like. The frame 200 is of a unibody construction in some cases, and in other cases, is constructed by joining two or more separate body pieces. Parts of the frame 200 are joined by any suitable variety of mechanisms, including, for example, welding, bolts, screws, other fasteners, epoxy, combinations thereof, or the like.

The electric machine 102 may include a hydraulic system 204 that move a dump box 206 or other moveable elements configured to move, lift, carry, and/or dump materials. The dump box 206 is used, for example, to pick up and carry dirt or mined ore from one location on the ground 104 to another location of the ground 104. The dump box 206 is actuated by the hydraulic system 204, or any other suitable mechanical system. In some cases, the hydraulic system 204 is powered by an electric motor (not shown), such as by powering hydraulic pump(s) (not shown) of the hydraulic system 204. It should be noted that in other types of machines (e.g., machines other than a mining truck) the hydraulic system 204 may be in a different configuration than the one shown herein, may be used to operate elements other than a dump box 206, and/or may be omitted.

With continued reference to FIG. 2, the electric machine 102 also includes an operator station 208. The operator station 208 is configured to seat an operator (not shown) therein. The operator seated in the operator station 208 interacts with various control interfaces and/or actuators within the operator station 208 to control movement of various components of the electric machine 102 and/or the overall movement of the electric machine 102 itself. Thus, control interfaces and/or actuators within the operator station 208 allow the control of the propulsion of the electric machine 102 by controlling operation of one or more motors 210. A motor controller 212 may be controlled according to operator inputs received at the operator station 208. In other cases, the motor controller 212 and other components of the electric machine may be controlled autonomously, such as by the controller 124 or other sitewide control system.

The motors 210 are powered by a battery pack or battery 214, with a battery controller 216. The motors 210 may be of any suitable type, such as induction motors, permanent magnet motors, switched reluctance (SR) motors, combinations thereof, or the like. The motors 210 are of any suitable voltage, current, and/or power rating. The motors 210 when operating together are configured to propel the electric machine 102 as needed for tasks that are to be performed by the electric machine 102. For example, the motors 210 may be rated for a range of about 500 volts to about 3000 volts. The motor controller 212 include one or more control electronics to control the operation of the motors 210. In some cases, each motor 210 may be controlled by its own motor controller 212. In other cases, all the motors of the electric machine 102 may be controlled by a single motor controller 212. The motor controller 212 may further include one or more inverters or other circuitry to control the energizing of magnetic flux generating elements (e.g., coils) of the motors 210. The motors 210 are mechanically coupled to a variety of drive train components, such as a drive shaft and/or axles or directly to the wheels 202 to rotate the wheels 202 and propel the electric machine 102. The drivetrain includes any variety of other components including, but not limited to a gear reduction, a differential, connector(s), constant velocity (CV) joints, etc. Although not shown here, there may be one or more motors 210 that are not used for propulsion of the electric machine 102, but rather to operate pumps and/or other auxiliary components, such as to operate the hydraulic systems 204.

According to examples of the disclosure, the power to energize the motors 210 is received from the battery 214, the segments of the trolley power system 108, or both the battery 214 and the segments 108. In some cases, the motors 210 may operate solely from the segments of the power trolley system 108. In other cases, the power received from the segments 108 to operate the motors 210 may be supplemented by power from the battery 214. Additionally, in many cases, the motors 210 and other elements of the electric machine 102 may operate from the power received from the segments 108 while concurrently charging the battery 214 of the electric machine 102.

In some cases, when the electric machine 102 is operated with energy from the battery 214 only, the electric machine 102 may be operated in a derated mode. This derated mode may reduce the peak power consumed by the electric machine 102, such that the peak power draw by the subcomponents (e.g., motors 210, hydraulic systems 204, etc.) do not exceed the power rating of the battery 214. In this way, the electric machine 102 may prevent damaging and/or excessively depleting the battery 214 during its operation using energy only from the battery 214. This derated mode may manifest in a reduced/limited speed, a reduced/limited force, or the like of actions performed by the electric machine 102.

The electric machine 102 may further optionally include a fuel tank 218 to store any variety of fuel, such as diesel, gasoline, or other hydrocarbon fuels. This fuel tank may be included only in the cases where the electrical machine 102 may have a supplementary power source, such as an internal combustion engine (not shown) or a fuel cell (not shown).

The battery 214 may be of any suitable type and capacity. For example, the battery may be a lithium ion battery, a lead-acid battery, an aluminum ion battery, a flow battery, a magnesium ion battery, a potassium ion battery, a sodium ion battery, a metal hydride battery, a nickel metal hydride battery, a cobalt metal hydride battery, a nickel-cadmium battery, a wet cell of any type, a dry cell of any type, a gel battery, combinations thereof, or the like. The battery 214 may be organized as a collection of electrochemical cells arranged to provide the voltage, current, and/or power requirements of the motors 210. In some cases, the energy capacity of the battery 214 may be a threshold amount more than the energy required for the electric machine 102 to traverse a single segment 108 that may be inoperable. In other cases, the energy capacity of the battery 214 may be a threshold amount more than the energy required for the electric machine 102 to traverse two segments 108 that may be inoperable, or any other predetermined number of inoperable segments 108. For example, if at a particular worksite 100, each segment is approximately 1 kilometer (km) long, the battery 214 of the electric machine 102 may have sufficient capacity to propel the electric machine by 1.5 km.

Indeed, the battery 214 capacity may be any suitable value relative to the energy needed to traverse a segment 108 on the worksite. For example, in some cases, the energy capacity of the battery 214 relative to the energy required by the corresponding electric machine 102 to traverse a typical single segment 108 at the worksite 100 may be in the range of about 1 to about 3. In other cases, the energy capacity of the battery 214 relative to the energy required by the corresponding electric machine 102 to traverse a typical single segment 108 at the worksite 100 may be in the range of about 1.1 to about 2.2. In still other cases, the energy capacity of the battery 214 relative to the energy required by the corresponding electric machine 102 to traverse a typical single segment 108 at the worksite 100 may be in the range of about 1.2 to about 1.7. These aforementioned ratios may generally be less than what would typically used for electric machines 102 that operate only from its on-board batteries, without the benefit of the trolley power system segments 108. It should be understood that the aforementioned ratios are examples, and the disclosure contemplates battery 214 energy capacity ranges outside of the aforementioned ranges.

The electric machine 102 may also include a regenerative braking system 222, which allows the electric machine 102 to recapture some of its kinetic energy while braking, which would otherwise be wasted. The regenerative braking system 222, when the electric machine is to slow down and/or stop, may apply a load to the wheels 202 that is further mechanically coupled to a generator or alternator. By this mechanism, the applied load of the regenerative braking system 222 opposes the torque of the wheels 202, resulting in slowing down and/or stopping the electric machine 102. At the same time, since the torque of the wheel drives an alternator/generator, the torque of the wheels and/or the kinetic energy of the electric machine 102 is at least partially transformed into electrical energy that is used to charge the battery 214. In this way, instead of losing kinetic energy of the electric machine 102 to heat during braking, at least some of the kinetic energy of the electric machine 102 can be recouped and stored in the battery 214.

The electric machine 102 includes controller 220 that controls various aspects of the electric machine 102. The controller 220 is configured to receive battery status (e.g., state-of-charge (SOC) or other charge related metrics) from the battery controller 216, operator signal(s), such as an accelerator signal, based at least in part on the operator's interactions with one or more control interfaces and/or actuators of the electric machine 102. In other cases, the controller 220 may receive control signals from a remote control system (e.g., controller 124) by wireless signals 118, received via an antenna 116. The controller 220 uses the operator signal(s), regardless of whether they are received from an operator in the operator station 208 or from the controller 124, to generate command signals to control various components of the electric machine 102. For example, the controller 220 may control the motors 210 via the motor controller 212, the hydraulic system 204, and/or steering of the electric machine 102 via a steering controller 224. It should be understood that the controller 220 may control any variety of other subsystems of the electric machine 102 that are not explicitly discussed here to provide the electric machine 102 with the operational capability discussed herein.

The controller 220, according to example of this disclosure, may be configured to provide an indication of remaining energy to operate the electric machine 102 on an energy gauge 226. The energy gauge 226, according to examples of the disclosure, may be configured to display the amount of energy available to operate the electric machine 102 based at least in part on the amount of charge remaining in the battery 214. In some cases, the energy gauge 226 may provide an indication of an estimated amount of time the electric machine 102 can be operated and/or an estimated amount of range the electric machine 102 has remaining. These estimates may be generated based on the amount of charge remaining in the battery 214, the recent usage of energy by the electric machine 102, and/or an estimate of the energy expended per unit time (e.g., power requirement) of a task in which the electric machine 102 is engaged. The energy gauge 226 may be configured to display, to an operator seated in the operator station 208, the amount of energy, time, and/or range remaining for operating the electric machine 102. Additionally or alternatively, the energy gauge 226 and/or the controller 220 and/or battery controller 216 may be configured to indicate, such as wirelessly via the antenna 116, the amount of charge (e.g., SOC), energy, time, and/or range remaining for operating the electric machine 102 to a remote operating system (e.g., controller 124).

The controller 220 includes single or multiple microprocessors, field programmable gate arrays (FPGAs), digital signal processors (DSPs), and/or other components configured to control the electric machine 102. Numerous commercially available microprocessors can be configured to perform the functions of the controller 220. Various known circuits are operably connected to and/or otherwise associated with the controller 220 and/or the other circuitry of the electric machine 102. Such circuits and/or circuit components include power supply circuitry, inverter circuitry, signal-conditioning circuitry, actuator driver circuitry, etc. The present disclosure, in any manner, is not restricted to the type of controller 220 or the positioning depicted of the controller 220 and/or the other components relative to the electric machine 102. The controller 220 is configured to cooperate with the controller 124 to control the use of energy from the battery 214 in a manner that enhances the range of the electric machine 102 and/or advance sitewide objectives, particularly when there are one or more faulted segments 108.

The electric machine 102 further includes any number of other components within the operator station 208 and/or at one or more other locations on the frame 200. These components include, for example, one or more of a location sensor (e.g., global positioning system (GPS)), an air conditioning system, a heating system, communications systems (e.g., radio, Wi-Fi connections), collision avoidance systems, sensors, cameras, etc. These systems are powered by any suitable mechanism, such as by using a direct current (DC) power supply powered by the battery 214.

It should be understood that the electric machine 102 as discussed herein, provides for control from a sitewide controller (e.g., controller 124) via wireless or wired signaling. This control by the controller 124, in cooperation with controller 220, may provide instructions to a human operator in the operator station 208 of the electric machine 102 or automatically control the operations of the electric machine 102 via controller 220. The change in operations (e.g., change in speed, change in route, or the like) of the electric machine 102 may be communicated by the controller 124 in response to one or more segments 108 at the worksite being rendered inoperable. For example, if a particular segment 108 on which the electric machine 102 is to use on its path is non-functioning, the controller 124 may reroute the electric machine 102 to avoid the faulted segment 108. In other examples, the controller may cause the electric machine 102 to slow down (e.g., travel at half-speed) on segments 108 prior to and/or subsequent to the faulted segment 108 so that the electric machine 102 spends additional time drawing power from the functional segment 108 to charge its battery 214 more fully and operate from the energy stored in the battery 214 when traversing the path along the faulted segment 108.

It will be appreciated that the electric machine 102 is optimized to have smaller on-board batteries due to the systems and methods as discussed herein, resulting in lower costs, improved reliability, and/or improved performance. At the same time, the electric machines 102, as well as the overall worksite 100 is more robust to the ill effects of electrical failures of trolley systems, in accordance with the disclosure herein.

Figure 3:
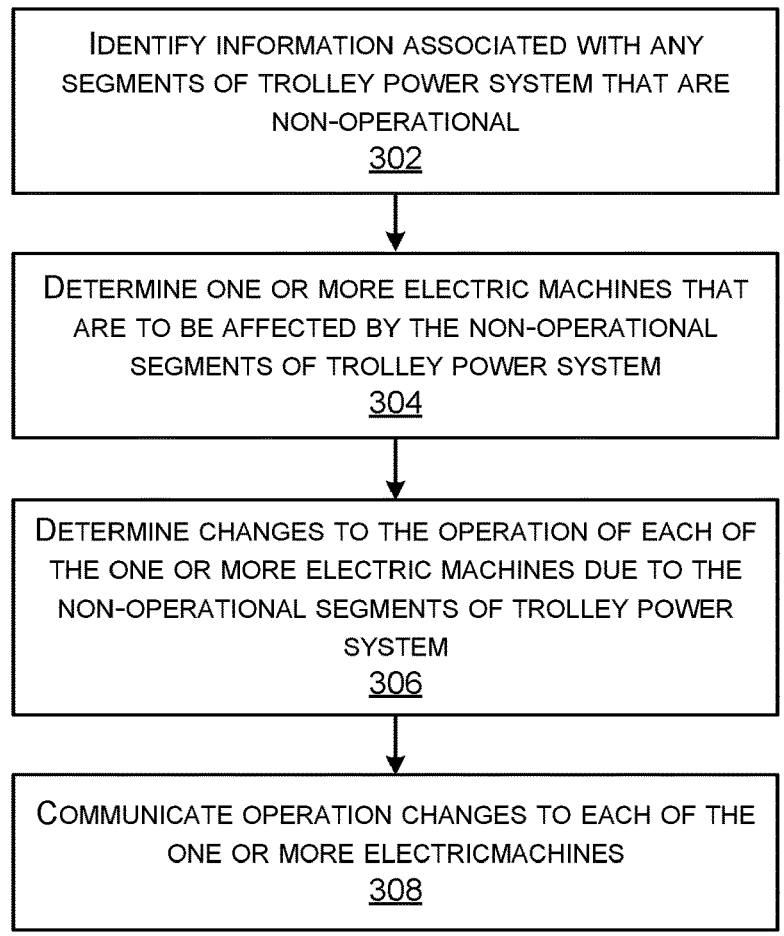
FIG. 3 is a flow diagram depicting an example method for communicating operational changes, responsive to a fault in the trolley power system, to the electric machine of FIG. 1, according to examples of the disclosure.

FIG. 3 is a flow diagram depicting an example method 300 for communicating operational changes, responsive to a fault in a segment of the trolley power system 108, to the electric machine 102 of FIG. 1, according to examples of the disclosure. The processes of method 300 may be performed by the controller 124, individually or in conjunction with the controller 220 and/or one or more other elements at worksite 100. Method 300 allows the electric machine 102 to operate even when one or more segments 108 are non-operational at the worksite 100.

At block 302, the controller 124 identifies information associated with any segments of the trolley power system 108 that are non-operational. In this sense, non-operational segments 108 are those segments 108 that are faulted and/or otherwise unable to deliver electrical power to the electric machines 102 at the worksite 100. The controller 124 may identify if particular segment(s) 108 of all the segments 108 at a worksite 100 are non-operational by receiving communications from any variety of entities. In some cases, the controller 124 may receive a signal from any variety of sources to indicate that a particular segment 108 is not currently supplying electrical power.

As one example, the segments 108 of the trolley power system 108 may report its operational status via sensors 128. These sensors 128 may include voltmeters, ammeters, or any other suitable mechanism to determine whether electrical power is flowing through the power lines 110 of the segment 108. The sensor 128 can determine whether the corresponding segment 108 is operational and wirelessly send a signal to the controller 124 indicating the operational status of the segment 108. In some cases, the sensor 128 may periodically report operational status of the corresponding segment 108 to the controller 124. In other cases, the sensor 128 may report, to the controller 124, a change in operational status of the corresponding segment (e.g., a change from operational to non-operational).

In other cases, the substations 106 may indicate to the controller 124 particular segments 108 that may be not be operational. The substations may recognize a fault in its own power delivery to one or more segments 108 and report the same to the controller 124. In yet other cases, a human operator 126 may identify that a particular segment 108 or segments 108 are non-operational and log the same with the controller via the electronic device 122. There may be other ways of the controller 124 identifying the segments 108 that are non-operational at the worksite 100, according to examples of the disclosure, other than the mechanisms discussed here.

At block 304, the controller 124 determines one or more electric machines 102 that are to be affected by the non-operational segments of the trolley power system 108. The controller 124 may assign each electric machine 102 at the worksite its current task, and therefore, the controller 124 will have information about the path that each of the electric machines will traverse on the ground 104 of the worksite 100. Thus, the controller 124 can determine the electric machines 102 that will, or likely will, be affected by any non-operational segments 108 at the worksite 100. The controller 124 can make an inventory of the electric machines 102 that are to be affected of any segment outages, and in some cases, the predicted time when the electric machine 102 is likely to be affected by the non-operational segments 108.

At block 306, the controller 124 determines changes to the operation of each of the one or more electric machines 102 due to the non-operational segments of the trolley power system 108. The controller 124 may determine any variety of changes to the operations of the electric machines 102 that are affected by outages of one or more segments 108. These operational changes may be to mitigate any work stoppage at the worksite 100 due to the non-operational segments 108. The operational changes may be based on a variety of factors, such as where particular electric machines 102 are currently located in the worksite 100, if there are alternate routes that particular electric machines 102 may be rerouted to for completing its current and/or future tasks, the topography of expected paths of particular electric machines 102, etc. The operational changes of one or more electric machines 102 may entail changes in speed, changes in routes, instructions to halt its current operations, instructions to perform a different task that removes load from the non-operational segments 108, etc. The controller 124 may be configured to determine different operational changes for different electric machines 102. For example, the controller 124 may determine that some electric machines 102 may need to have a different operating speed, while other electric machines 102 may need to be rerouted, while yet other electric machines 102 may be temporarily idled and other non-electric machines may be deployed in their place.

At block 308, the controller 124 communicates the operation changes to each of the one or more electric machines 102 for which the operations are to be modified. The controller 124 may wirelessly and/or in a wired fashion transmit a message that includes parameters that are to be modified in the operation of the respective receiving electric machine 102. For example, the controller 124 may transmit a message that instructs a particular electric machine to reduce its speed and provide a speed parameter that indicates that speed. In other cases, the controller 124 may transmit a message to another particular electric machine 102 to instruct that machine to traverse a different route, such as by sending parameters of destination coordinates and/or additional coordinates of waypoints.

It should be noted that some of the operations of method 300 may be performed out of the order presented, with additional elements, and/or without some elements. Some of the operations of method 300 may further take place substantially concurrently and, therefore, may conclude in an order different from the order of operations shown above.

It should be understood that the method 300 improves the robustness of worksite 100 operations, by allowing electric machines 102 to continue performing tasks, even when one or more segments 108 may not be providing electric power to the electric machines 102 at the worksite 100. By coordinating changes to the operations of electric machines 102 responsive to fault(s) in power delivery, overall usable uptime of electric machines 102 is improved.

FIG. 4 is a flow diagram depicting an example method 400 for communicating a change in speed, responsive to a fault in the trolley power system, to the electric machine of FIG. 1, according to examples of the disclosure. The processes of method 400 may be performed by the controller 124, individually or in conjunction with the controller 220 and/or one or more other elements at worksite 100. Method 400 allows the electric machine 102 to operate at a different speed (e.g., a reduced speed), even when one or more segments 108 are non-operational at the worksite 100.

At block 402, the controller 124 determines that a segment of the trolley power system 108 is non-operational. In this sense, a non-operational segment 108 is a segment 108 that is faulted and/or otherwise unable to deliver electrical power to the electric machines 102 at the worksite 100. The controller 124 may identify if particular segment(s) 108 of all the segments 108 at a worksite 100 are non-operational by receiving communications from any variety of entities. In some cases, the controller 124 may receive a signal from any variety of sources, such as the sensors 128, to indicate that a particular segment 108 is not currently supplying electrical power.

At block 404, the controller 124 identifies an electric machine 102 that is to approach the inoperable segment of the trolley power system 108. The controller 124 identifies the electric machine 102 that is to approach the inoperable segment 108 based on the task(s) assigned to that electric machine 102 and the layout of the worksite 100. Since the controller 124 had previously assigned tasks to the electric machine 102, the controller will be able to determine whether the electric machine 102 is scheduled to operate using the faulted segment 108. In some cases, the controller 124 may receive current location information about the electric machine 102, such as GPS coordinates from the controller 220, to ascertain whether the electric machine 102 will be approaching the inoperable segment 108.

At block 406, the controller 124 determines the state-of-charge (SOC) of the battery 214 of the electric machine 102. This process may be optional, in some cases. The controller 220 and/or the battery controller 216 may determine and report the SOC to the controller 124, such as via wireless signals 118. The SOC may indicate the total amount of charge (e.g., coulombs of charge) of the battery 214 or charge as a percentage of the capacity of the battery 214. In some cases, the SOC may be used to determine changes in the operating parameters of the electric machine 102, but in other cases, the SOC may not be considered to determine changes in the operating parameters of the electric machine 102, responsive to a fault in one or more segments 108. In some cases, the controller 124 may also compare the current SOC level to the energy needs of the tasks assigned to the electric machine 102 in determining any changes to the operation of the electric machine 102. For example, an electric machine 102 with a relatively high SOC may have a smaller change in its operating speed compared to another electric machine 102 with a relatively lower SOC when both the electric machines 102 are to complete similar types of tasks.

At block 408, the controller 124 determines, based at least in part on the SOC and the inoperable segment 108, a change in speed to be implemented for the electric machine 102. It should be noted that in some alternative cases, the SOC may not be considered in making the determination of the change in speed to be implemented for the electric machine 102. The change in speed, such as a reduction in speed, for the electric machine 102 allows for the electric machine 102 to be connected to operational segment(s) 108 for a longer period of time, before the electric machine 102 comes to the inoperable segment 108. This allows for the battery 214 of the electric machine 102 to be charged to a greater degree (e.g., greater SOC) before the electric machine 102 goes to the inoperable segment 108. By charging up the battery 214 to a greater level, particularly a level that exceeds the change needed to traverse the inoperable segment 108, the electric machine 102 is able to operate using its on-board battery 214 to traverse the ground 104 corresponding to the inoperable segment 108, without having to draw power from the inoperable segment 108.

In some cases, the controller 124 may cause the electric machine 102 to slow down while connected to segments 108 prior to the segment(s) 108 that are inoperable. In other cases, the controller 124 may cause the electric machine 102 to slow down while connected to segments 108 after the segment(s) 108 that are inoperable. In yet other cases, the controller 124 may cause the electric machine 102 to slow down while connected to segments 108 both prior to and after the segment(s) 108 that are inoperable. As noted above, the battery 214 of the electric machine 102 and/or the SOC level thereon may be such that the electric machine 102 has sufficient charge to traverse the length of the inoperable segment(s) 108 even if a sufficient slowed-down operation prior to the inoperable segment(s) 108 is not possible.

In some examples of the disclosure, the controller 124 may determine that the electric machine 102 ought to reduce its speed to a range between about 90% to about 10% of its original speed. In other cases, the controller 124 may determine that the electric machine 102 ought to reduce its speed to a range between about 70% to about 30%. In still other cases, the controller 124 may determine that the electric machine 102 ought to reduce its speed to a range between 40% and 60%.

As an example, the controller 124 may determine that a particular electric machine 102 is to reduce its speed, responsive to an upcoming inoperable segment 108, to 50% of its original speed. In this case, the electric machine 102 would spend twice as much time operating and charging its battery 214 on prior operable segments 108, approximately resulting in twice as much or more charging from those segment(s) 108 prior to the inoperable segment 108. For example, if a particular electric machine 102 in the form of a mining truck has a normal speed of 50 km/h, and it will be approaching an inoperable segment 108, the controller 124 may determine that the electric machine 102 is to reduce its speed to 25 km/h (50% reduction). Correspondingly, if under the normal speed of operation, the battery 214 of the electric machine 102 would have an SOC of 27% by the time the electric machine 102 comes to the inoperable segment 108, with the reduced speed implemented, the estimated SOC may be 60%, or so.

As another example, the controller 124 may determine that a particular electric machine 102 is to reduce its speed, responsive to an upcoming inoperable segment 108, to 25% of its original speed. In this case, the electric machine 102 would spend four times as much time operating and charging its battery 214 on prior operable segments 108, approximately resulting in quadruple or more charging from those segment(s) 108 prior to the inoperable segment 108. For example, if a particular electric machine 102 in the form of a backhoe has a normal speed of 40 km/h, and it will be approaching an inoperable segment 108, the controller 124 may determine that the electric machine 102 is to reduce its speed to 10 km/h (25% of original speed). Correspondingly, if under the normal speed of operation, the battery 214 of the electric machine 102 would have an SOC of 15% by the time the electric machine 102 comes to the inoperable segment 108, with the reduced speed implemented, the estimated SOC may be 65%, or so.

It should be understood that the amount of time spent on operable segments may not correspond linearly to the amount of charge (e.g., SOC) of a battery 214 of an electric machine 102. This is because the battery 214 likely has some charge in it prior to dwelling on operable segments 108. Additionally, the amount of energy and/or charge consumed may not scale linearly with speed. For example, operating at a lower speed may not result in the same percentage reduction of energy usage as the percentage reduction of the speed. This is because there are a variety of non-linear factors involved, such as static friction, dynamic friction, internal inefficiencies of motors 210, limitations of on-board battery 214 charging rate capacity, etc. However, the controller 124 may, in some cases, have different speed-charge models and/or look-up tables that it can employ to estimate the charge benefits from speed reduction for any variety of corresponding types (e.g., mining trucks, dozers, etc.) of electric machines 102.

According to examples of the disclosure, the controller 124 may provide system-level (e.g., worksite 100 workflow) robustness when multiple segments 108 may be rendered inoperable. Thus, the controller 124 may provide different levels of speed adjustments and/or a combination of operational adjustments when more than one segment 108 may be inoperable. For example, if a particular electric machine 102 is approaching a single inoperable segment 108, the controller may determine that that electric machine 102 is to reduce its speed by a first level. However, if the electric machine 102 is approaching two successive inoperable segments 108, the controller 124 may determine that the electric machine 102 is to reduce its speed by a second level that is greater (i.e., lower operational speed) than the first level.

At block 410, the controller 124 communicates the request for the change in speed to the electric machine 102. The controller 124 may wirelessly and/or in a wired fashion transmit a message that includes a speed parameter (e.g., speed level, percentage reduction form current speed, etc.) to which the electric machine 102 is to adjust its speed. For example, the controller 124 may transmit a message that instructs a particular electric machine to reduce its speed to 20 km/h and provide a speed parameter that indicates that speed. This message may be received by the controller 220 of the electric machine 102 and implemented in the case of an autonomously controlled electric machine 102 or displayed to an operator via one or more human-machine interfaces (HMI), in the case of a human operated electric machine 102, to request the operator to reduce the speed of the electric machine 102 according to the instructions from the controller 124.

It should be noted that some of the operations of method 400 may be performed out of the order presented, with additional elements, and/or without some elements. Some of the operations of method 400 may further take place substantially concurrently and, therefore, may conclude in an order different from the order of operations shown above.

FIG. 5 is a flow diagram depicting an example method for communicating a change in route, responsive to a fault in the trolley power system, to the electric machine of FIG. 1, according to examples of the disclosure. The processes of method 500 may be performed by the controller 124, individually or in conjunction with the controller 220 and/or one or more other elements at worksite 100. Method 500 allows the electric machine 102 to operate, such as by rerouting the electric machine 102, even when one or more segments 108 are not operating at the worksite 100.

At block 502, the controller 124 determines that a segment of the trolley power system 108 is inoperable. In this sense, an inoperable segment 108 is a segment 108 that is faulted and/or otherwise unable to deliver electrical power to the electric machines 102 at the worksite 100. The controller 124 may identify if particular segment(s) 108 of all the segments 108 at a worksite 100 are inoperable by receiving communications from any variety of entities. In some cases, the controller 124 may receive a signal from any variety of sources, such as the sensors 128, to indicate that a particular segment 108 is not currently supplying electrical power.

At block 504, the controller 124 identifies an electric machine 102 that is to approach the inoperable segment 108 of the trolley power system 108. The controller 124 identifies the electric machine 102 that is to approach the inoperable segment 108 based on the task(s) assigned to that electric machine 102 and the layout of the worksite 100. Since the controller 124 had previously assigned tasks to the electric machine 102, the controller will be able to determine whether the electric machine 102 is scheduled to operate using the faulted segment 108. In some cases, the controller 124 may receive current location information about the electric machine 102, such as GPS coordinates from the controller 220, to ascertain whether the electric machine 102 will be approaching the inoperable segment 108.

At block 506, the controller 124 determines the state-of-charge (SOC) of the battery 214 of the electric machine 102. This process may be optional, in some cases. The controller 220 and/or the battery controller 216 may determine and report the SOC to the controller 124, such as via wireless signals 118. The SOC may indicate the total amount of change (e.g., coulombs of charge) of the battery 214 or charge as a percentage of the capacity of the battery 214. In some cases, the SOC may be used to determine changes in the operating parameters of the electric machine 102, but in other cases, the SOC may not be considered to determine changes in the operating parameters of the electric machine 102, responsive to a fault in one or more segments 108.

At block 508, the controller 124 determines, based at least in part on the SOC and the inoperable segment 108, a new route for the electric machine 102. It should be noted that in some alternative cases, the SOC may not be considered in making the determination of the change in route for the electric machine 102. The change in route, such as an alternate route to avoid the inoperable segment 108, for the electric machine 102 allows for the electric machine 102 to be connected to operational segment(s) 108 to perform its task(s). This allows for the battery 214 of the electric machine 102 to continue to be charged by avoiding the inoperable segment 108. In alternative cases, the electric machine 102 may be sent to stationary chargers for charging. In some cases, non-electrically driven machines may be deployed in place of electric machines 102, by the controller 124, when one or more segments 108 are inoperable.

At block 510, the controller 124 communicates the request for the change in route to the electric machine 102. The controller 124 may wirelessly and/or in a wired fashion transmit a route parameter (e.g., new destination, end coordinates, a heading, one or more waypoints, etc.) to which the electric machine 102 is to adjust its route. For example, the controller 124 may transmit a message that instructs the electric machine 102 to head to a new point at the worksite, indicated as a location coordinate. This message may be received by the controller 220 of the electric machine 102 and implemented in the case of an autonomously controlled electric machine 102 or displayed to an operator via one or more HMIs, in the case of a human operated electric machine 102, to request the operator to reroute the electric machine 102 according to the instructions from the controller 124.

It should be noted that some of the operations of method 500 may be performed out of the order presented, with additional elements, and/or without some elements. Some of the operations of method 500 may further take place substantially concurrently and, therefore, may conclude in an order different from the order of operations shown above.

Figure 6:
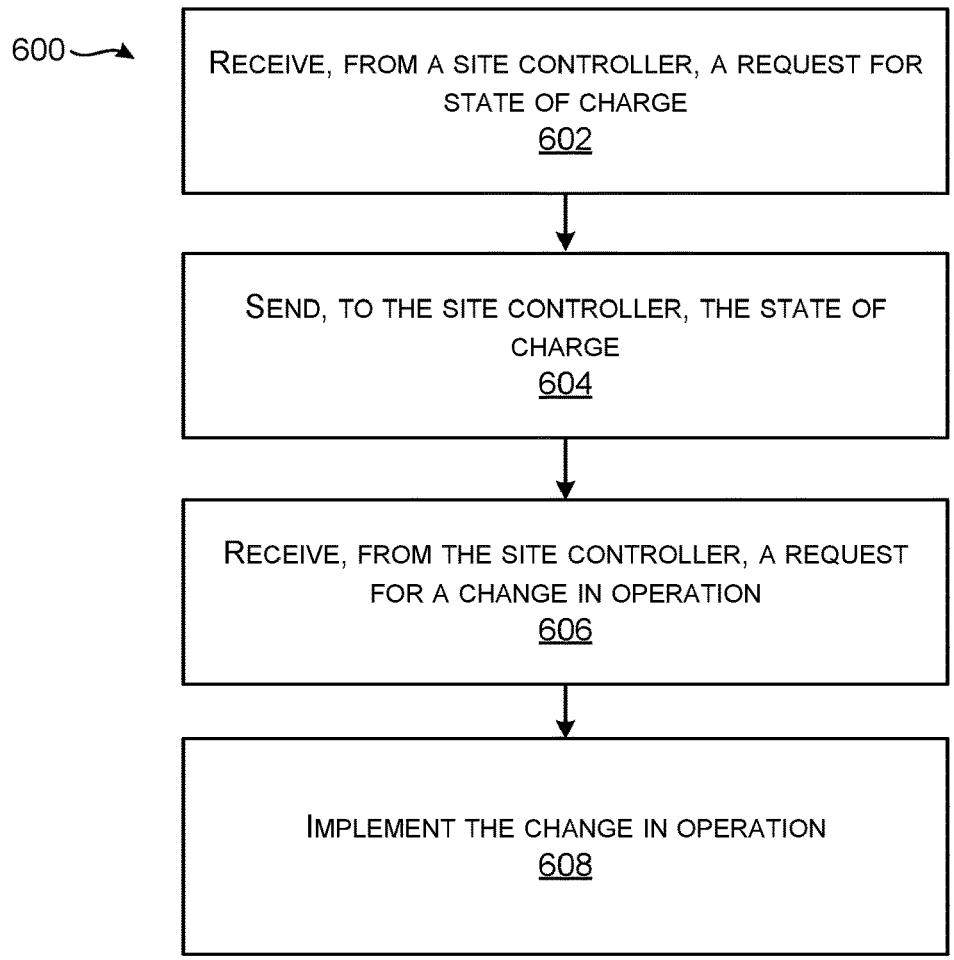
FIG. 6 is a flow diagram depicting an example method for receiving operational instruction and changing operations of the electric machine of FIG. 1, according to examples of the disclosure.

FIG. 6 is a flow diagram depicting an example method 600 for receiving operational instruction and changing operations of the electric machine of FIG. 1, according to examples of the disclosure. The processes of method 600 may be performed by the controller 220, individually or in conjunction with one or more other components of electric machine 102. In general, the controller 220 receives instructions from the controller 124 and controls its electric machine 102 according to the instructions received from the controller 124.

At block 602, the controller 220 receives, from the site controller 124, a request for state of charge (SOC). This operation may be optional, as in some cases, change in operation of the electric machine 102 may not be based in part on the SOC. The controller 220 may receive the request for SOC wirelessly or in a wired fashion. The controller 220, responsive to the request for SOC, may interact with the battery controller 216 to determine the SOC of the battery 214.

At block 604, the controller 220 sends, to the site controller 124, the SOC. The SOC level, either as a total amount of charge or as a percentage of the battery 214 capacity, may be sent to the controller 124 wirelessly or in a wired fashion. Again, this operation may be optional, since in some cases, the controller 124 may not consider the SOC of the battery 214 of the electric machine 102 in determining any operational changes for the electric machine 102.

At block 606, the controller 220 receives, from the site controller 124, a request for a change in operation. This request may be a message that instructs any variety of changes to the operation of the electric machine 102, such as a change in speed, a change in rout, and/or to idle. The controller 220 may receive this message wirelessly or via wired channels from the controller 124. The change in operations of the electric machine 102 may be instructed by the controller 124 based at least in part on one or more segments 108 at the worksite 100 being faulted, according to examples of the disclosure.

At block 608, the controller 220 implements the change in operation. In some cases, the controller 220 may display the requested change in operation to an operator in the operator station 208 via one or more HMIs. In other cases, the controller 220 may interact with one or more other controllers and/or systems of the electric machine 102, such as the steering controller 224, the hydraulic system 204, etc., to implement the requested change(s) in operation of the electric machine 102.

It should be noted that some of the operations of method 600 may be performed out of the order presented, with additional elements, and/or without some elements. Some of the operations of method 600 may further take place substantially concurrently and, therefore, may conclude in an order different from the order of operations shown above.

FIG. 7 are charts 700, 710 illustrating the control of the electric machine of FIG. 1 when a fault in a segment of a trolley power system 108 is encountered, according to examples of the disclosure. Chart 700 depicts a situation where a segment 108 is rendered non-operational, but no change is made to the operation of an electric machine 102 approaching the non-operational segment 108. As the electric machine 102 traverses a first segment of trolley power system 108, the battery 214 charges according to curve 702. However, this charging is during a normal operational speed, without taking into account that the subsequent segment 108 is faulted. Thus, the electric machine 102 does not slow down to replenish its battery 214 more completely, and as the curve 704 shows, when the electric machine 102 operates using its on-board battery 214, it depletes the charge in its battery 214 while traversing the ground 104 corresponding to the non-operational segment 108. In fact, because the electric machine could not traverse the entirety of the non-operational segment 108, it could not reach a third operational segment 108.

In contrast to the chart 700, the chart 710 demonstrates operation of the electric machine 102 according to the disclosure herein. The controller 124, recognizing that the second segment cannot provide power to the electric machine 102 instructs the electric machine 102 to slow down, resulting the in the curve 712. Due to the slower speed of the electric machine 102, the curve 712 is steeper, as the electric machine 102 accumulates more charge in its battery 214 per unit distance while traversing the first segment 108. Then, during the second segment 108, which is inoperable, the electric machine 102 operates using its own on-board battery 214. However, this time, because the electric machine 102 attained a sufficient amount of charge its battery 214 while traversing the first segment 108, according to examples of the disclosure, the electric machine 102 is able to traverse the second segment 108, which is inoperable, as depicted in curve 714. The electric machine 102 is, therefore able to make it to the third segment 108, where the electric machine 102 can again charge its battery 214, according to the curve 716.

As discussed herein, the controller 124, by slowing down the electric machine 102 on operating segments 108, can increase the charge to distance ratio, thereby increasing the end charge of the battery 214 when exiting the operating segment 108 relative to the scenario where the electric machine 102 is not slowed down. As a result of the additional charge in the battery 214, the electric machine 102 is able to traverse faulted segments 108 without depleting its battery 214. Thus, the disclosure herein, allows for more robust and fault-tolerant operations of electric machines 102 and further prevents electric machines 102 from being stranded, without power, while traversing faulted segments 108.

Figure 8:
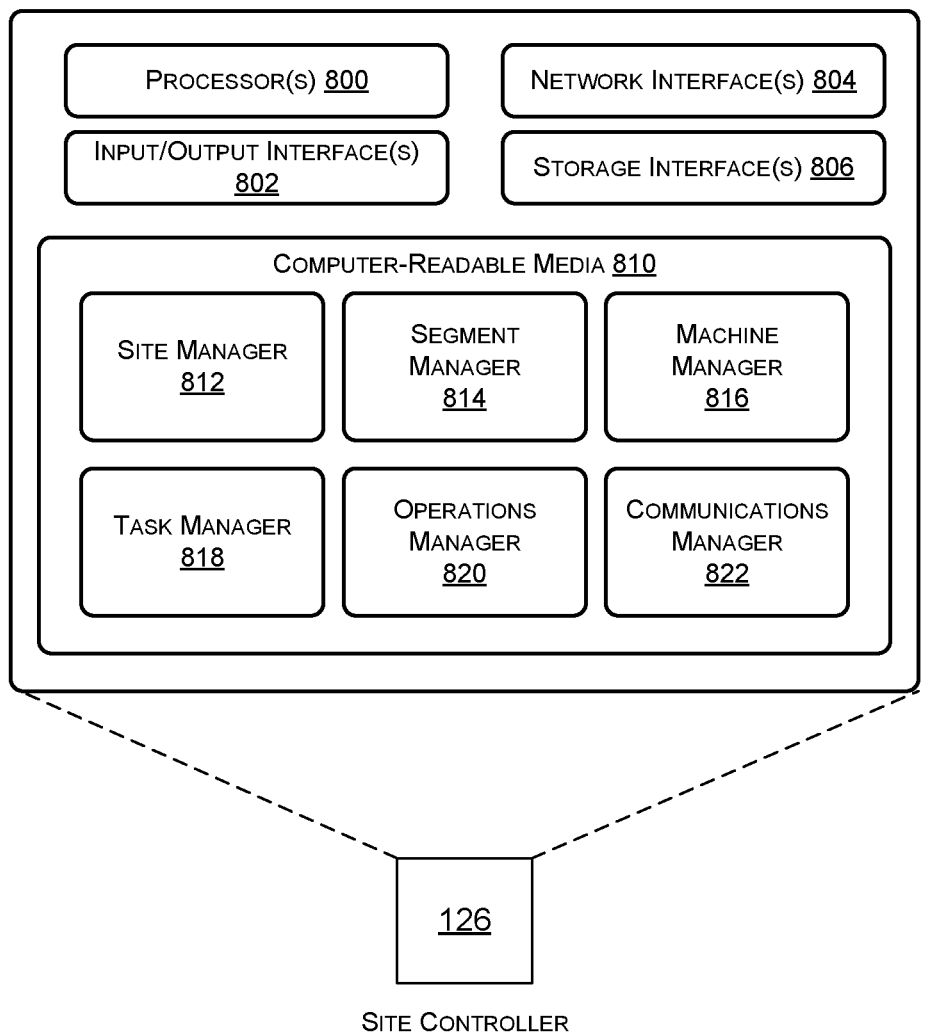
FIG. 8 is a block diagram of an example site controller that may modify operational parameters of the electric machine of FIG. 1, according to examples of the disclosure.

FIG. 8 is a block diagram of an example site controller 124 that may modify operational parameters of the electric machine of FIG. 1, according to examples of the disclosure. The controller 124 includes one or more processor(s) 800, one or more input/output (I/O) interface(s) 802, one or more communication interface(s) 804, one or more storage interface(s) 806, and computer-readable media 810. In examples, the processor(s), I/O interfaces 802, communications interface(s) 804, storage interface(s) 806, and/or computer-readable memory 810 may be part of the electronic device 122.

In some implementations, the processors(s) 800 may include a central processing unit (CPU), a graphics processing unit (GPU), both CPU and GPU, a microprocessor, a digital signal processor or other processing units or components known in the art. Alternatively, or in addition, the functionally described herein can be performed, at least in part, by one or more hardware logic components. For example, and without limitation, illustrative types of hardware logic components that may be used include field-programmable gate arrays (FPGAs), application-specific integrated circuits (ASICs), application-specific standard products (ASSPs), system-on-a-chip systems (SOCs), complex programmable logic devices (CPLDs), etc. Additionally, each of the processor(s) 800 may possess its own local memory, which also may store program modules, program data, and/or one or more operating systems. The one or more processor(s) 800 may include one or more cores.

The one or more input/output (I/O) interface(s) 802 may enable the controller 124 to detect interaction with a human operator 126. For example, the operator 126 may provide task instructions to be executed by electric machines 102 at the worksite 100. Thus, the I/O interface(s) 802 may include and/or enable the controller 124 to receive indications of what actions the electric machine 102 is to perform.

The network interface(s) 804 may enable the controller 124 to communicate via the one or more network(s). The network interface(s) 804 may include a combination of hardware, software, and/or firmware and may include software drivers for enabling any variety of protocol-based communications, and any variety of wireline and/or wireless ports/antennas. For example, the network interface(s) 804 may comprise one or more of WiFi, cellular radio, a wireless (e.g., IEEE 802.1x-based) interface, a Bluetooth® interface, and the like. In some cases, if a remote control is used to control the electric machine 102, one or more operator signals may be sent by the controller 124.

The storage interface(s) 806 may enable the processor(s) 800 to interface and exchange data with the computer-readable medium 810, as well as any storage device(s) external to the controller 124. The storage interface(s) 806 may further enable access to removable media.

The computer-readable media 810 may include volatile and/or nonvolatile memory, removable and non-removable media implemented in any method or technology for storage of information, such as computer-readable instructions, data structures, program modules, or other data. Such memory includes, but is not limited to, RAM, ROM, EEPROM, flash memory or other memory technology, CD-ROM, digital versatile discs (DVD) or other optical storage, magnetic cassettes, magnetic tape, magnetic disk storage or other magnetic storage devices, RAID storage systems, or any other medium which can be used to store the desired information and which can be accessed by a computing device. The computer-readable media 810 may be implemented as computer-readable storage media (CRSM), which may be any available physical media accessible by the processor(s) 800 to execute instructions stored on the memory 810. In one basic implementation, CRSM may include random access memory (RAM) and Flash memory. In other implementations, CRSM may include, but is not limited to, read-only memory (ROM), electrically erasable programmable read-only memory (EEPROM), or any other tangible medium which can be used to store the desired information, and which can be accessed by the processor(s) 800. The computer-readable media 810 may have an operating system (OS) and/or a variety of suitable applications stored thereon. The OS, when executed by the processor(s) 800 may enable management of hardware and/or software resources of the controller 124.

Several components such as instruction, data stores, and so forth may be stored within the computer-readable media 810 and configured to execute on the processor(s) 802. The computer readable media 810 may have stored thereon a site manager 812, a segment manager 814, a machine manager 816, a task manager 818, an operations manager 820, and a communications manager 822. It will be appreciated that each of the components 812, 814, 816, 818, 820, 822 may have instructions stored thereon that when executed by the processor(s) 800 may enable various functions pertaining to operating the electric machine 102, as described herein.

The instructions stored in the site manager 812, when executed by the processor(s) 800, may configure the controller 124 to identify features of the worksite 100, such as the locations, lengths, available power, etc. of the various segments of the trolley power system 108 deployed at the worksite 100. The processor(s) 800 may also be configured to identify any topological features associated with the worksite 100.

The instructions stored in the segment manager 814, when executed by the processor(s) 800, may configure the controller 124 to identify the segments of the trolley power system 108 deployed at the worksite 100 and the operational status of those segments 108. The processor(s) 800 may be configured to receive status updates associated with each of the segments 108 from any variety of sources, such as sensors 128 and/or substations 106. The processor(s) 800 may be configured to identify when a particular segment 108 becomes faulted and when a faulted segment 108 is repaired and becomes operational.

The instructions stored in the machine manager 816, when executed by the processor(s) 800, may configure the controller 124 to identify the locations, identities, and/or specifications of a variety of electric machines 102 deployed at the worksite 100. The processor(s) 800 may also be configured to identify operating status associated with each of the electric machines 102, such as a SOC of the batteries 214 of each of the electric machines 102.

The instructions stored in the task manager 818, when executed by the processor(s) 800, may configure the controller 124 to provide tasks to electric machines 102 at the worksite 100. The tasks may be assigned based on overall goals at the worksite 100 and may take into account a variety of factors, such as machine availability, weather conditions, or the like.

The instructions stored in the operations manager 820, when executed by the processor(s) 800, may configure the controller 124 to send updated parameters to change operations of one or more electric machines 102. For example, the processor(s) 800 may determine and send, to an electric machine 102, a speed parameter to update a prior speed of operation of that electric machine 102. Similarly, the processor(s) 800 may determine and send parameters (e.g., destination, waypoints, etc.) associated with rerouting electric machines 102 deployed at the worksite 100.

The instructions stored in the communications manager 822, when executed by the processor(s) 800, may configure the controller 124 to communicate with the one or more electric machines 102 at the worksite 100 by any suitable mechanisms, such as wired or wireless communications. The processor(s) 800 may be configured to receive status information from the electric machines 102, such as state-of-charge (SOC) of their batteries 214. The processor(s) 800 may also be configured to send requests for a change in operations to each of the electric machines 102. For example, the processor(s) 800 may be able to transmit anew speed parameter to an electric machine 102 to cause that electric machine 102 to change its speed according to the speed parameter.

The disclosure is described above with reference to block and flow diagrams of systems, methods, apparatuses, and/or computer program products according to the disclosure. It will be understood that one or more blocks of the block diagrams and flow diagrams, and combinations of blocks in the block diagrams and flow diagrams, respectively, can be implemented by computer-executable program instructions. Likewise, some blocks of the block diagrams and flow diagrams may not necessarily need to be performed in the order presented or may not necessarily need to be performed at all, according to some examples of the disclosure.

Computer-executable program instructions may be loaded onto a general-purpose computer, a special-purpose computer, a processor, or other programmable data processing apparatus to produce a particular machine, such that the instructions that execute on the computer, processor, or other programmable data processing apparatus create means for implementing one or more functions specified in the flowchart block or blocks. These computer program instructions may also be stored in a computer-readable memory that can direct a computer or other programmable data processing apparatus to function in a particular manner, such that the instructions stored in the computer-readable memory produce an article of manufacture including instruction means that implement one or more functions specified in the flow diagram block or blocks. As an example, the disclosure may provide for a computer program product, comprising a computer usable medium having a computer readable program code or program instructions embodied therein, said computer readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process such that the instructions that execute on the computer or other programmable apparatus provide elements or steps for implementing the functions specified in the flow diagram block or blocks.

It will be appreciated that each of the memories and data storage devices described herein can store data and information for subsequent retrieval. The memories and databases can be in communication with each other and/or other databases, such as a centralized database, or other types of data storage devices. When needed, data or information stored in a memory or database may be transmitted to a centralized database capable of receiving data, information, or data records from more than one database or other data storage devices. In other cases, the databases shown can be integrated or distributed into any number of databases or other data storage devices.

Industrial Applicability

The present disclosure describes systems and methods for providing risk-tolerant mechanisms for high electric machine usage at a worksite 100. Electric machines 102 have on-board batteries 214 that traditionally need to be charged, such as at a stationary charging station. The charging of large batteries for large construction or farming equipment may take a relatively long time, particularly compared to refueling traditional diesel or gasoline powered machines. As a result, it is desirable to implement a trolley power system, where an electric machine 102 can dynamically draw power for its own operations and further to charge its on-board batteries 214. The trolley power system, therefore, mitigates the need for charging downtime related to electrical machines 102, resulting in greater deployment of machinery. This results in improved financial metrics related to capital expenditures, such as greater ROI and ROC, as well as greater productivity from worksite 100 assets.

In addition to worksite 100 efficiencies, a trolley power system introduces additional advantages with respect to the electric machines 102 themselves. Because the electric machines 102 can draw power while engaging in productive tasks, the on-board batteries of the electric machines 102 can be right-sized to smaller sizes. By having reduced size of the on-board batteries 214, the electric machines 102 of this configuration have an additional advantage of reduced cost and weight and increased reliability compared to traditional electric machines.

The trolley power system, however, may introduce reliability issues. For example, a single point failure may halt sitewide operations. However, the disclosure herein, provides a fault-tolerant system and method for powering electrical vehicles that is highly robust to single point failures within the trolley power systems. By dividing the trolley power system into segments 108, single point failures in one segment can be isolated and other operational segments can be used to continue operations at the worksite 100. Sitewide control can be used to modify the operations of electric machines 102 that may be affected by one or more segments 108 being rendered inoperable, but the sitewide activities can continue, mostly unhindered. This leads to improved levels of worker and capital efficiency, greater uptime and greater field usage of construction equipment, and greater efficiency of construction, mining, agriculture, and/or transportation projects.

Although the systems and methods of electric machines 102 are discussed in the context of a mining trucks and other mining machinery, it should be appreciated that the systems and methods discussed herein may be applied to a wide array of machines and vehicles across a wide variety of industries, such as construction, mining, farming, transportation, military, combinations thereof, or the like. For example, the fault-tolerant mechanism disclosed herein may be applied to a compactor in the paving industry or a harvester in the farming industry.

While aspects of the present disclosure have been particularly shown and described with reference to the examples above, it will be understood by those skilled in the art that various additional examples may be contemplated by the modification of the disclosed machines, systems and methods without departing from the spirit and scope of what is disclosed. Such examples should be understood to fall within the scope of the present disclosure as determined based upon the claims and any equivalents thereof.

Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein.

What is claimed is:

1. A site controller, comprising:
   one or more processors; and
   one or more computer-readable media storing computer-executable instructions that, when executed by the one or more processors, cause the one or more processors to:
   determine that a first segment of a plurality of segments of a trolley power system is faulted;
   determine that a first electric machine will approach the first segment;
   determine, based at least in part on the first segment being faulted and the first electric machine approaching the first segment, that an operation of the first electric machine is to be changed;
   determine a value of a parameter associated with the operation that is to be changed; and
   send, to the first electric machine, the value of the parameter.

2. The site controller of claim 1, wherein the computer-executable instructions, when executed by the one or more processors, further cause the one or more processors to:
   receive, from the first electric machine, an indication of a state-of-charge (SOC) associated with a battery of the first electric machine, wherein the value of the parameter is further based at least in part on the SOC.

3. The site controller of claim 1, wherein to determine that the first segment of the plurality of segments of the trolley power system is faulted further comprises receiving an indication of a fault from a sensor associated with the first segment.

4. The site controller of claim 1, wherein the computer-executable instructions, when executed by the one or more processors, further cause the one or more processors to:
   identifying a current location of the first electric machine; and
   identifying a current task of the first electric machine, wherein to determine that a first electric machine will approach the first segment is based at least in part on the current location and the current task.

5. The site controller of claim 1, wherein the operation of the first electric machine to be changed comprises changing speed of the first machine from a first speed to a second speed.

6. The site controller of claim 5, wherein the parameter indicates the second speed.

7. The site controller of claim 5, wherein the second speed is 50% or less than the first speed.

8. The site controller of claim 1, wherein the operation of the first electric machine to be changed comprises changing a route of the first electric machine from a first route to a second route.

9. The site controller of claim 8, wherein the parameter indicates coordinates of a destination of the second route.

10. The site controller of claim 1, wherein the first electric machine includes a battery that has an energy capacity sufficient to move the first electric machine a distance that is no more than two times a length of the first segment.

11. A method, comprising:
    determining, by a site controller, that a first segment of a plurality of segments of a trolley power system is faulted;
    determining, by the site controller, that a first electric machine will approach the first segment;
    determining, by the site controller and based at least in part on the first segment being faulted and the first electric machine approaching the first segment, that an operating speed of the first electric machine is to be reduced from an original speed to a new speed while the first electric machine is drawing power from a second segment; and
    sending, by the site controller and to the first electric machine, a message indicating the new speed.

12. The method of claim 11, further comprising:
    receiving, by the site controller and from the first electric machine, an indication of a state-of-charge (SOC) associated with a battery of the first electric machine, wherein the new speed is further based at least in part on the SOC.

13. The method of claim 11, further comprising:
    determining, by the site controller, that a second electric machine will approach the first segment;
    determining, by the site controller and based at least in part on the first segment being faulted and the second electric machine approaching the first segment, that a second operating speed of the second electric machine is to be reduced from a second original speed to a second new speed; and
    sending, by the site controller and to the second electric machine, a second message indicating the second new speed.

14. The method of claim 13, wherein the second new speed is different from the new speed.

15. The method of claim 11, wherein the new speed is 50% or less than the original speed.

16. The method of claim 11, further comprising:
determining, by the site controller, that a second electric machine will approach the first segment;
determining, by the site controller and based at least in part on the first segment being faulted and the second electric machine approaching the first segment, that an original route of the second electric machine is to be modified to a new route; and
sending, by the site controller and to the second electric machine, a second message indicating the new route.

17. The method of claim 11, further comprising:
determining, by a site controller, that a third segment of the plurality of segments of the trolley power system is faulted;
  determining, by the site controller, that a second electric machine will approach the third segment;
  determining, by the site controller and based at least in part on the third segment being faulted and the second electric machine approaching the third segment, that a second operating speed of the second electric machine is to be reduced from a second original speed to a second new speed; and
sending, by the site controller and to the second electric machine, a second message indicating the second new speed, wherein the second new speed is different from the new speed.

* * * * *